(12) United States Patent
Hui et al.

(10) Patent No.: US 6,580,275 B2
(45) Date of Patent: Jun. 17, 2003

(54) SINGLE SENSOR CONTROL OF POWER CONVERTERS

(75) Inventors: Shu-Yuen Ron Hui, Shatin (HK); Shu-Hung Henry Chung, Hong Kong (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 09/870,408

(22) Filed: May 30, 2001

(65) Prior Publication Data

US 2002/0030493 A1 Mar. 14, 2002

Related U.S. Application Data

(60) Provisional application No. 60/208,343, filed on May 31, 2000.

(51) Int. Cl.⁷ ............................................. G01R 31/00
(52) U.S. Cl. ..................................... 324/414; 323/223
(58) Field of Search ......................... 323/223; 315/224, 315/291, 287; 324/414, 654, 76.75

(56) References Cited

U.S. PATENT DOCUMENTS

| | | | | |
|---|---|---|---|---|
| 4,288,739 A | * | 9/1981 | Nercessian | 323/275 |
| 4,346,332 A | * | 8/1982 | Walden | 315/224 |
| 4,810,950 A | * | 3/1989 | Young | 324/603 |
| 4,866,367 A | * | 9/1989 | Ridley et al. | 323/287 |
| 5,475,296 A | | 12/1995 | Vinsant et al. | 323/233 |
| 5,602,463 A | | 2/1997 | Bendall et al. | 323/266 |

OTHER PUBLICATIONS

Ohnuki et al., "Control of a Three–Phase PWM Rectifier Using Estimated AC–Side and DC–Side Voltages," *IBEE Transactions on Power Electronics*, vol. 14, No. 2, (Mar. 1999).

* cited by examiner

*Primary Examiner*—Christine Oda
*Assistant Examiner*—Vincent Q. Nguyen
(74) *Attorney, Agent, or Firm*—Merchant & Gould P.C.

(57) ABSTRACT

An apparatus and method for determining the characteristic(s) of a discharge lamp (for example a fluorescent lamp or a high-intensity discharge lamp) operated by a high-frequency electronic ballast including a resonant tank that includes an inductor and a capacitor, wherein the characteristic(s) are selected from the group consisting of lamp input voltage, lamp resistance and lamp power, and including capability for measuring the inductor voltage and/or current, and capability for determining the characteristic(s) from the measured inductor voltage and/or current. More generally, the apparatus and method provide techniques for determining a number of parameters of a power converter circuit simply from measuring an inductor voltage or inductor current.

22 Claims, 10 Drawing Sheets

Auxiliary winding used as voltage sensor $V_{g1}(G1)$ and $V_{g2}(G2)$.

$V_{in}$ (upper trace) and $V_L$ (lower trace).

$V_{out}$ (upper trace) and $i_L$ (lower trace).

Lamp power and DC link voltage.

Lamp power and lamp resistance

H(n) versus n, R's range — [300Ω, 3kΩ]

The error of $V_{out}$ under different R.

$v_S(t), v_L(t)$ and $v_{OUT}(t)$ $i_L(t), i_C(t)$ and $i_R(t)$

The estimated $V_{DC}'$ and the actual $V_{DC}$

The estimated $R_{lamp}'$ and the actual $R_{lamp}$

The estimated $P_{lamp}'$ and the actual $P_{lamp}$

US 6,580,275 B2

SINGLE SENSOR CONTROL OF POWER CONVERTERS

This application claims the benefit of U.S. Provisional Application No. 60/208,343 filed May 31, 2000, entitled SINGLE VOLTAGE SENSOR CONTROL OF POWER CONVERTERS, and which is in its entirety incorporated herewith by reference.

FIELD OF THE INVENTION

This invention relates to methods and apparatus for the control of power converters and the like circuitry, and particular to methods and apparatus for such control that do not require direct sensing of input and/or output voltages. The invention relates in particular to methods and apparatus for determining the operating characteristics of a discharge lamp (for example a fluorescent discharge lamp or a high-intensity discharge lamp) such as lamp power, lamp resistance and input voltage.

BACKGROUND OF THE INVENTION

Switching power converters are widely used in a large number of domestic and industrial applications. Examples include computer systems, motor drivers, and uninterruptible power supplies. With recent advances in semiconductor technologies and electronic packaging techniques, much research has been done on new power circuit topologies, switching scheme, and control techniques for improving the converter efficiency, electrical specifications, and power density—all the time meeting various industrial standards. Examples of well known power converter topologies include buck converters, boost converters, buck boost converters, flyback converters and forward converters.

An underlying concept of power electronics is to be able to use low-level signals to control high power converter outputs. Conventionally this requires a comparison of the actual output voltage with a desired reference voltage and then giving commands to the power converters. However, it is common practice that the power conversion stage and the control circuit be isolated in order to avoid noise coupling and grounding problems. In some situations input and output isolation in the power conversion stage is also desirable or necessary. These isolation requirements means that signal-power interface techniques such as transformer coupling and optical isolation are necessary to achieve output regulation. These requirements substantially increase the cost and complexity of power converters.

PRIOR ART

One solution to this difficulty is to control switching power converters by using current sensors only and without requiring the use of voltage sensors. Such a system was described in T. Ohnuki, O. Miyashita, P. Lataire & G. Matson *IEEE Transactions on Power Electronics*, Vol. 14 No. 2 March 1999. In the system proposed in this paper only current sensors are used that generate signals in response to the currents flowing in inductors. The sensed current can in theory be used to obtain the input and output voltages so as to provide control information. The use of current sensors alone has a number of advantages including a reduction in the number of sensors needed, and it obviates the need to use a dissipative voltage divider, such as a resistive network, to obtain the input voltage in feedforward arrangements and in output voltage regulation. Additionally, no voltage isolator (such as an optical coupler) is needed to isolate the high-voltage output and the low-voltage control signals. This has an additional advantage in that some optical isolators have a finite linear range, eliminating the need for such isolators therefore increases the practical voltage measurement range.

Since the current can be sensed using a contactless flux linkage sensor such as a Hall effect sensor, electrical isolation between the power conversion stage and the control state may be achieved easily. This has the effect that the power and ground signals can be separated inherently so as to reduce noise coupling.

The proposal of this piece of prior art has, however, a number of practical drawbacks. Most importantly, it assumes that the circuit is an ideal circuit, which in reality no such circuit ever would be. In addition, the current rather than being continuously sensed is simply sampled once in every switching cycle with the inevitable approximations and inaccuracies that this implies. An improvement on this technique is disclosed in the Applicants application Ser. No. 09/524,041, U.S. Pat. No. 6,297,621, which is incorporated herein by reference.

SUMMARY OF THE INVENTION

According to the present invention there is provided apparatus for determining the characteristic(s) of a discharge lamp operated by a high-frequency electronic ballast including a resonant tank comprising an inductor and a capacitor, wherein said characteristic(s) are selected from the group consisting of lamp input voltage, lamp resistance and lamp power, comprising means for measuring the inductor voltage and/or current, and means for determining said characteristic(s) from the measured inductor voltage and/or current.

By means of this invention, at least in its preferred forms, the control variables (such as input and output voltages) and the characteristics of the load (such as a discharge lamp) may be obtained more easily than in the prior art. For example, any significant changes in the lamp resistance may indicate lamp instability or failure, and since by means of the present invention the lamp resistance can be monitored remotely through measurements of the inductor voltage or current, the lamp resistance can be monitored remotely to identify any instability or failure. In addition, the present invention may be employed to detect load condition to facilitate load monitoring (for stability control for example).

In preferred embodiments of the invention the apparatus may comprise means for obtaining the lamp current and the maximum inductor voltage from the measured inductor voltage and/or current, and the characteristic(s) determining means may then determine the characteristics from the lamp current and maximum inductor voltage.

In one embodiment the apparatus comprises a sensor for measuring the inductor voltage, means for differentiating the inductor voltage to obtain a capacitor current, means for integrating the inductor voltage to obtain an inductor current, means for obtaining the lamp current from the capacitor current and the inductor current, and peak detector means for detecting the maximum inductor voltage.

In another embodiment the apparatus comprises a sensor for measuring inductor current, means for differentiating the inductor current to obtain an inductor voltage, means for differentiating the inductor voltage to obtain an capacitor current, means for obtaining the lamp current from the capacitor current and the inductor current, and peak detector means for detecting the maximum inductor voltage.

Viewed from another aspect the present invention provides apparatus for determining the lamp power, lamp resistance and input voltage of a discharge lamp driven by a power converter circuit including an inductor, comprising means for measuring the inductor voltage or inductor current, and means for determining the lamp power, lamp resistance and/or input voltage from said measured inductor voltage or inductor current.

Viewed from a still further aspect the invention provides a method for determining the characteristic(s) of a discharge lamp operated by a high-frequency electronic ballast including a resonant tank comprising an inductor and a capacitor, wherein said characteristic(s) are selected from the group consisting of lamp input voltage, lamp resistance and lamp power, comprising measuring the inductor voltage and/or current, and determining said characteristic(s) from the measured inductor voltage and/or current.

More generally still the present invention provides apparatus for determining the input and/or output voltages of a power electronics converter circuit including an inductor, comprising means for sensing the voltage across the inductor, and means for calculating the input and output voltages from the inductor voltage. Preferably the apparatus may also be able to calculate the load resistance from the inductor voltage.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

The present invention, at least in its preferred forms, involves the use of an isolated or non-isolated voltage sensor to obtain the voltage across an inductor that forms part of a power electronic converter. The measured voltage may be used to determine the AC current flowing in the inductor, and from that a number of other variables, such as the input and output voltages, can be determined.

Figure 1:
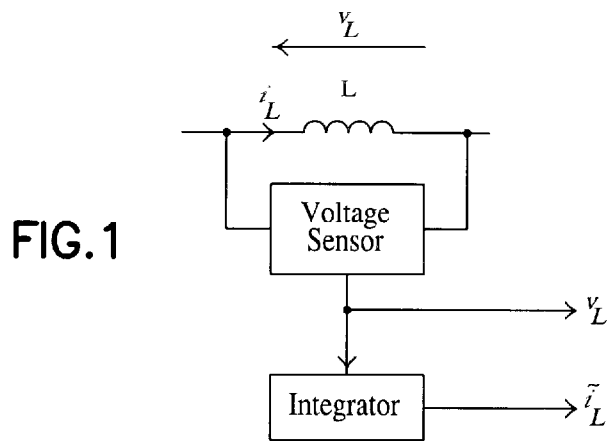
FIG. 1 illustrates the basic principle of the present invention.

FIG. 1 shows the basic idea. Mathematically the inductor voltage and the inductor current can be expressed as:

$$v_L = L \frac{di_L}{d_l} \Rightarrow i_L = \frac{1}{L} \int v_L d_l$$

Where L is the inductance of the inductor and $i_L$ is the AC component of the inductor current $I_L$. It can be seen from this relationship that the AC current flowing through an inductor can be obtained by integrating the sensed inductor voltage, and thus that a single voltage sensor can give both the voltage and current information. Thus the number of sensors needed can be reduced.

Figure 2:
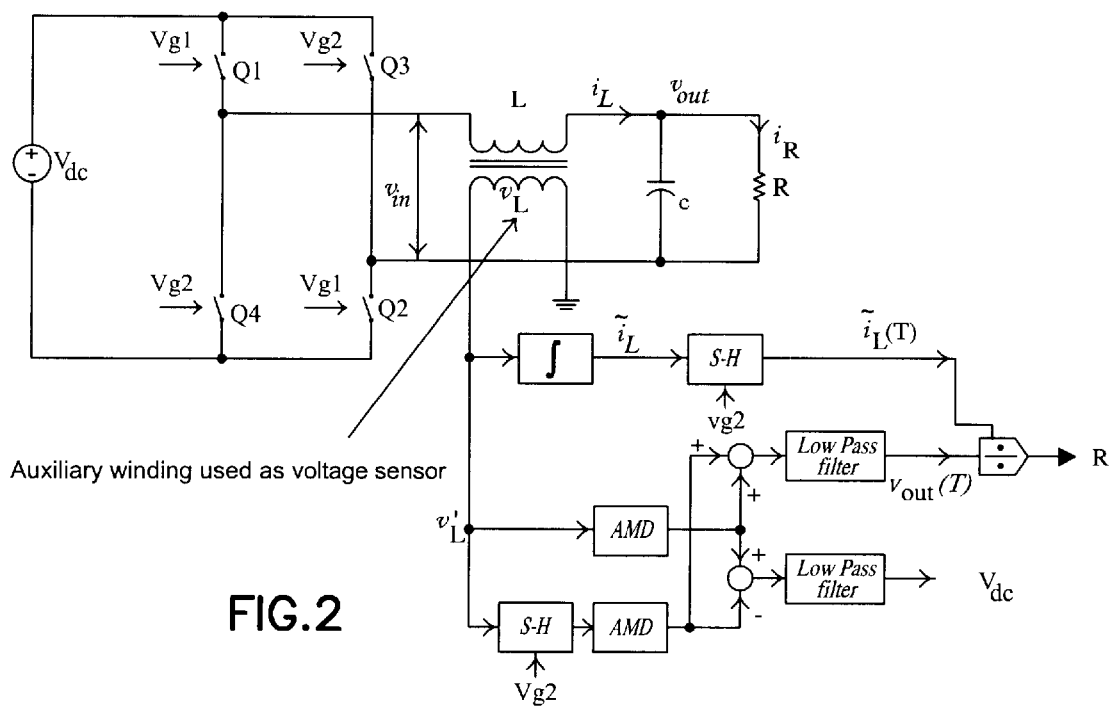
FIG. 2 is a circuit diagram of a first embodiment of the invention in the form of a series-loaded parallel-resonant inverter, FIGS. 3($a$)–($c$) show the key waveforms of the inverter of FIG. 2 in one switching cycle.
Figure 3A:
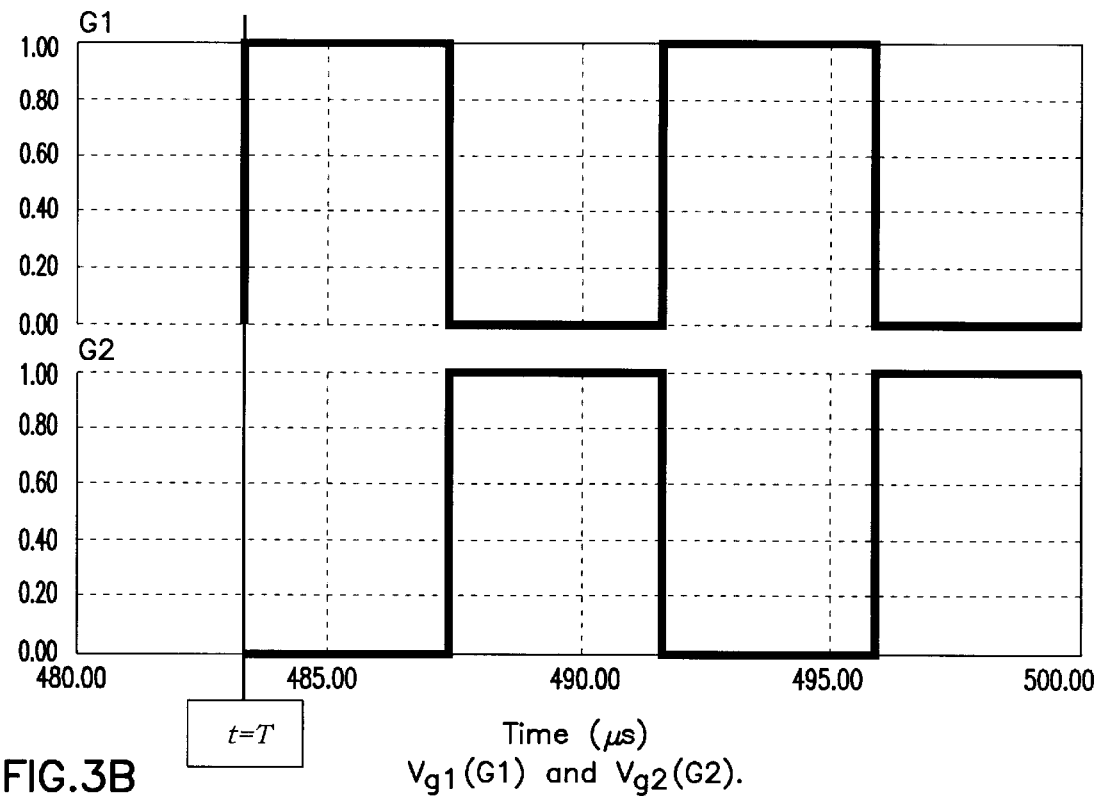
Figure 3B:
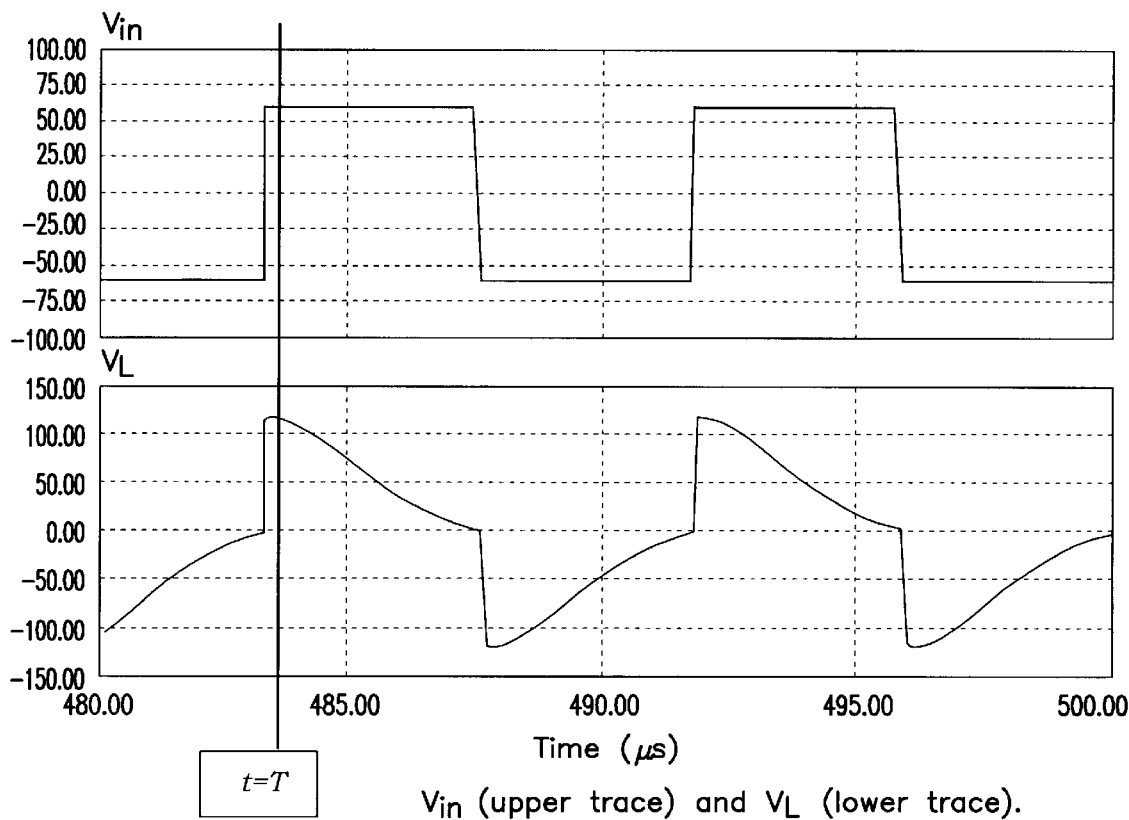
Figure 3C:
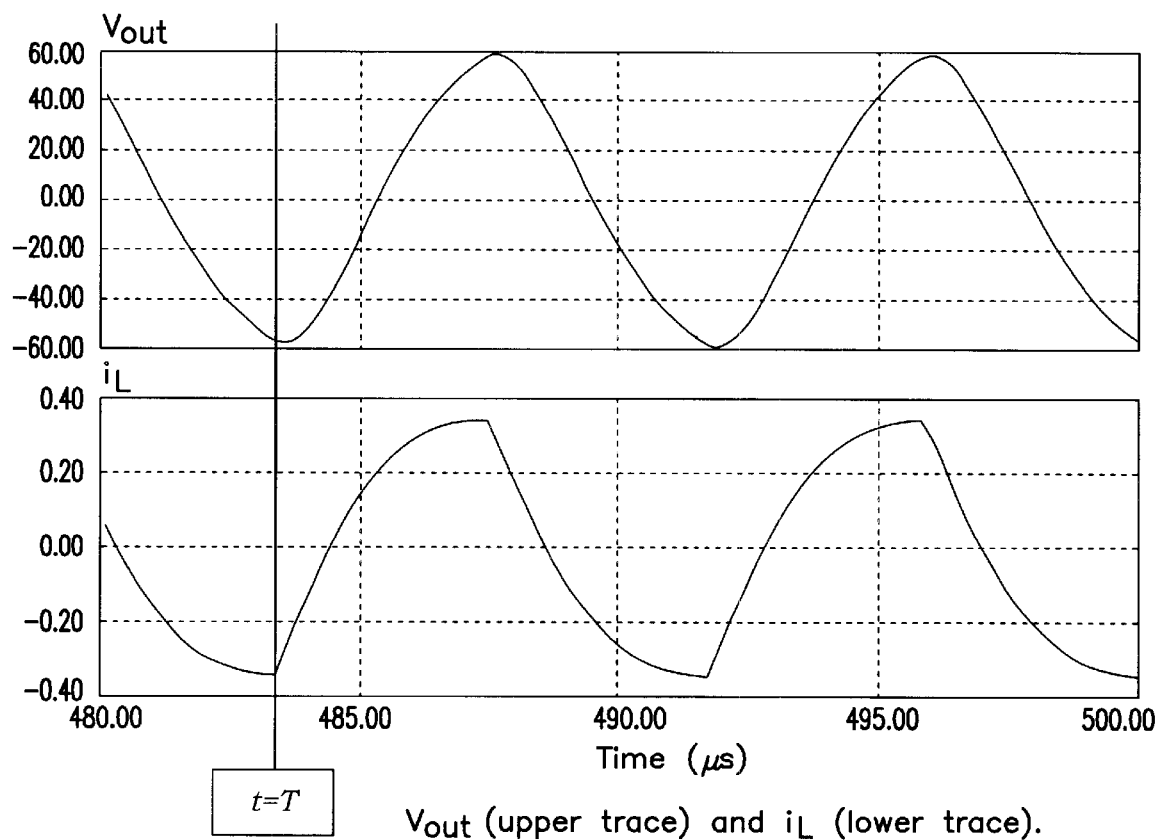

FIG. 2 shows a first embodiment of this invention in the form of a series-loaded parallel resonant inverter, as is used for example in applications such as electronic ballasts. An input voltage $V_{dc}$ is applied and the lamp may be considered as an output load R. FIGS. 3($a$)–($c$) show the key waveforms in one switching cycle of the converter. The switching frequency $f_s$ (=$1T_s$) of the switches is slightly higher than the natural frequency of the output resonant tank circuit. The gate signals of all the switches (ie $S_1$–$S_4$) are controlled by either $v_{g1}$ or $v_{g2}$. As shown in FIG. 3($a$) gate voltages $v_{g1}$ and $v_{g2}$ are in an anti-phase relationship. Thus the voltage across the input of the resonant tank circuit is in a square wave form, and in particular there is a voltage change of $2V_{dc}$ when the switch pair $S_1$ and $S_2$ is switched into $S_3$ and $S_4$.

The time instant at t=T is considered in the following. By using the Kirchoff voltage law, $$-V_{dc} = v_L(T^-) + v_{out}(T^-) \quad (1)$$

$$V_{dc} = v_L(T^+) + v_{out}(T^+) \quad (2)$$

As the output voltage $v_{out}$ is relatively constant at the switching instant ($v_{out}(T^+) \approx v_{out}(T^-)$), $v_{out}$ at t=T can be determined by adding (1) and (2), that is to say:

$$-[v_{out}(T^+) + v_{out}(T^-)] = v_L(T^+) + v_L(T^-)$$

$$v_{out}(T) \approx -\tfrac{1}{2}[v_L(T^+) + v_L(T^-)]$$

In addition the input voltage $V_{dc}$ can also be determined by subtracting (1) from (2) so that $$V_{dc} = -\tfrac{1}{2}[v_L(T^+) - v_L(T^-)]$$

Thus it can be seen that both the input and output voltages can be determined from a measurement of only the inductor voltage, and thus only a single sensor is required in order to determine both the input and output voltage. In particular the input and output voltages can be derived by synchronizing the sample-and-hold (S/H) circuit with the gate signals. This is shown in FIG. 2 in which it will be seen that the gate voltage $v_{g2}$ not only controls the switches but also controls the S/H circuit so that the inductor voltage is sampled and held at the switching instant. It will also be noted that because the inductor voltage will in fact be varying with the switching frequency it must be subject to amplitude demodulation using amplitude modulation demodulator circuits (AMD) capable of demodulating non-sinusoidal time-varying pulses of fixed frequency. As can also be seen from FIG. 2, an integrating circuit is used to integrate the inductor voltage to obtain the inductor current which is fed to a S/H circuit also controlled by the gate voltage. By obtaining both inductor current and output voltage it is also possible to obtain the load resistance R by dividing the calculated output voltage by the sampled inductor current obtained from integrating the measured inductor voltage.

A second embodiment of the invention will now be described in which the resistance of a discharge lamp operated by a high-frequency electronic ballast may be monitored. When a discharge lamp is being dimmed the lamp resistance varies with the dimming level. This resistance is difficult to detect directly in real time, but using the single sensor principle of the present invention and a simple circuit design it is possible to estimate with a reasonable degree of accuracy the on-line characteristic. In this example, a single sensor is used to derive the load resistance (R), the load power (P), load voltage $V_{OUT}$ and the DC link voltage ($V_{DC}$).

Figure 4A:
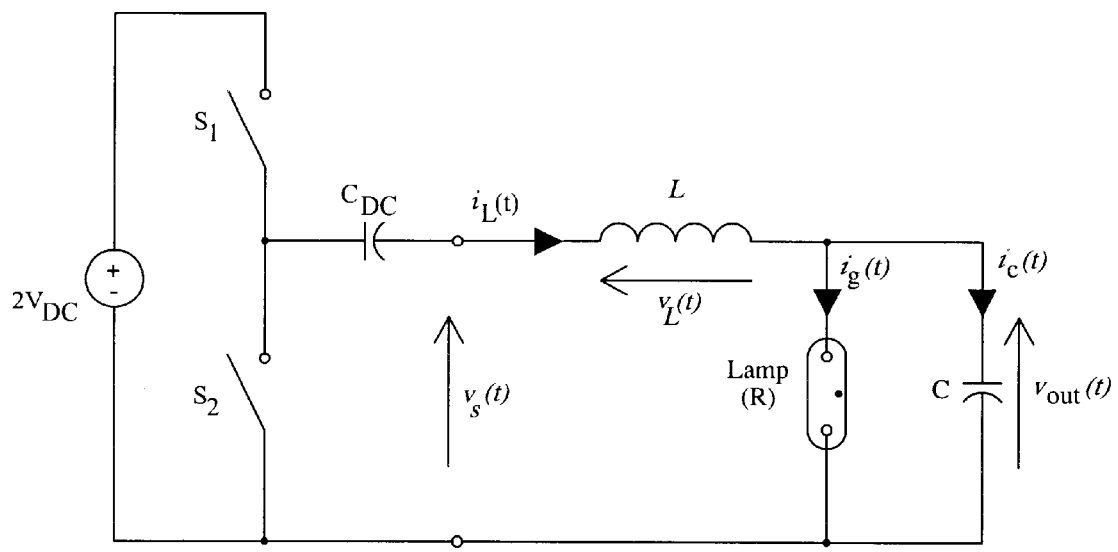
FIG. 4 shows ($a$) a typical electronic ballast circuit and ($b$) its equivalent circuit.
Figure 4B:
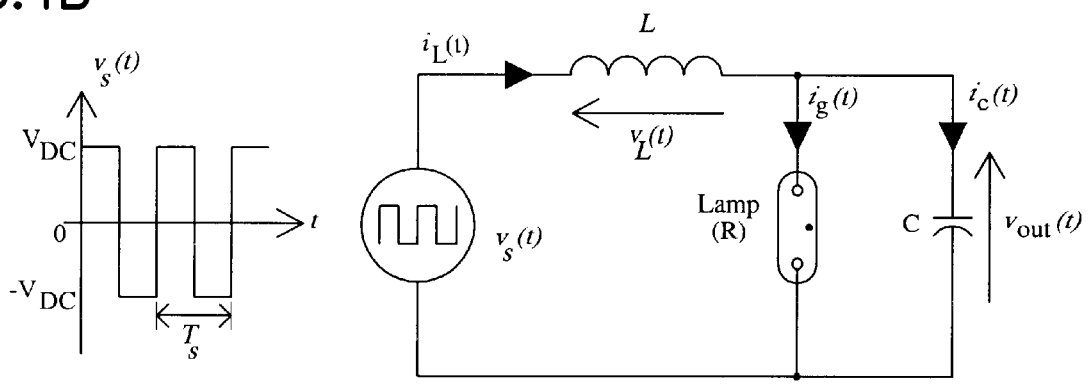
Figure 5A:
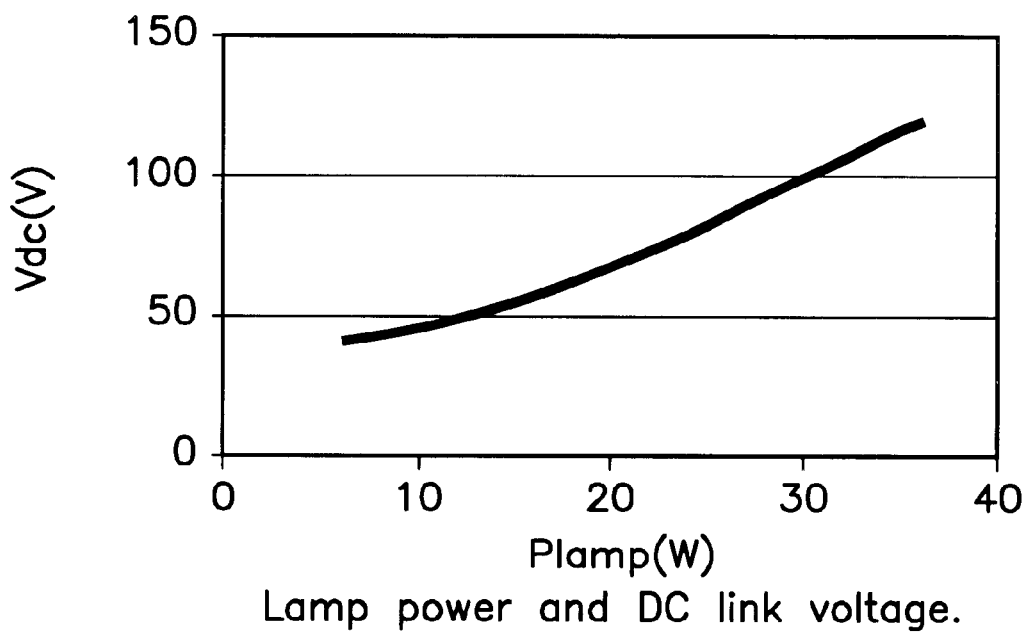
FIG. 5 shows the relationship between ($a$) lamp power and DC link voltage and ($b$) lamp power and lamp resistance for a typical fluorescent lamp.

FIG. 4(a) shows a typical electronic ballast circuit as is commonly used for a discharge lamp. FIG. 4(b) shows the equivalent circuit. Two switches S1 and S3 are switched alternately in order to generate an ac rectangular voltage across the load. The dc blocking capacitor $C_{DC}$ eliminates the dc voltage so that only the ac voltage component is applied across the resonant tank (formed of L and C) and the load (ie the discharge lamp in this example). FIGS. 5(a) and (b) show typical lamp characteristics of a GEC 40W-SW fluorescent lamp as a function of lamp power when driven by a circuit such as that of FIG. 4(a). Before describing an embodiment of the present invention in which the parameters of such a fluorescent lamp may be monitored using a single sensor, it is firstly necessary to consider the theory behind the circuit of FIG. 4(a).

The square wave $v_s(t)$ of FIG. 4(b) can be expressed as $$v_S(t) = \frac{4V_{DC}}{\pi} \sum_{n=1}^{+\infty} \frac{1}{n} \sin(n\omega_S t), \quad n \text{ is odd} \quad (3)$$

where $V_{DC}$ is the RMS value of $v_s(t)$ and is named as the DC link voltage from now on, $\omega_s$ is the angular switching frequency, $\omega_s = 2\pi/T_s$.

The relationship between $v_s(t)$, $v_L(t)$ and $v_{OUT}(t)$ is $$v_s(t) = v_L(t) + v_{OUT}(t) \quad (4)$$

$$v_S(t) = L\frac{d i_L(t)}{dt} + v_{OUT}(t) \quad (5)$$

$$= L\frac{d[i_C(t) + i_R(t)]}{dt} + v_{OUT}(t)$$

$$= LC\frac{d^2 v_{OUT}(t)}{dt^2} + \frac{L}{R}\frac{d v_{OUT}(t)}{dt} + v_{OUT}(t)$$

Assume $$\frac{d V_{OUT}(0)}{dt} = 0$$

and $v_{OUT}(0)=0$, only consider the fundamental component of $v_s(t)$, $$v_{SI}(t) = \frac{4V_{DC}}{\pi} \sin(\omega_S t) \quad (6)$$

Then the solution of the differential equation (5) is $$v_{OUTI}(t) = -\frac{4V_{DC}}{\pi} \frac{R[\omega_S L \cos(\omega_S t) + R(\omega_S C \omega_S L - 1)\sin(\omega_S t)]}{(\omega_S L)^2 + R^2(\omega_S L \omega_S C - 1)^2} \quad (7)$$

The RMS value of $v_{OUT1}(t)$ is $$V_{OUTI} = \frac{4V_{DC}}{\sqrt{2}\,\pi} \frac{R}{\sqrt{(\omega_S L)^2 + R^2(\omega_S L \omega_S C - 1)^2}} \quad (8)$$

$$\frac{V_{OUTI}}{V_S} = \frac{2\sqrt{2}}{\pi} \frac{R}{\sqrt{(\omega_S L)^2 + R^2(\omega_S L \omega_S C - 1)^2}} = \frac{2\sqrt{2}}{\pi} H(1) \quad (9)$$

where H(1) is the transfer function of the fundamental component.

Consider the harmonic components of $v_s(t)$, $$v_{SH}(t) = \frac{4V_{DC}}{\pi} \sum_{n=3}^{+\infty} \frac{1}{n} \sin(n\omega_S t) \quad (10)$$

$$v_{OUTH}(t) = \quad (11)$$

$$-\frac{4V_{DC}R}{\pi} \sum_{n=3}^{+\infty} \frac{n\omega_S L \cos(n\omega_S t) + R(n\omega_S C n\omega_S L - 1)\sin(n\omega_S t)}{n[(n\omega_S L)^2 + R^2(n\omega_S L n\omega_S C - 1)^2]}$$

$$\frac{V_{OUTH}}{V_S} = \frac{2\sqrt{2}}{\pi} \sqrt{\sum_{n=3}^{+\infty} \left(\frac{R}{n\sqrt{(n\omega_S L)^2 + R^2(n\omega_S L n\omega_S C - 1)^2}}\right)^2} = \quad (12)$$

$$\frac{2\sqrt{2}}{\pi} \sqrt{\sum_{n=3}^{+\infty} \left(\frac{H(n)}{n}\right)^2}$$

where H(n) is the transfer function of the $n^{th}$ harmonic component.

Figure 6A:
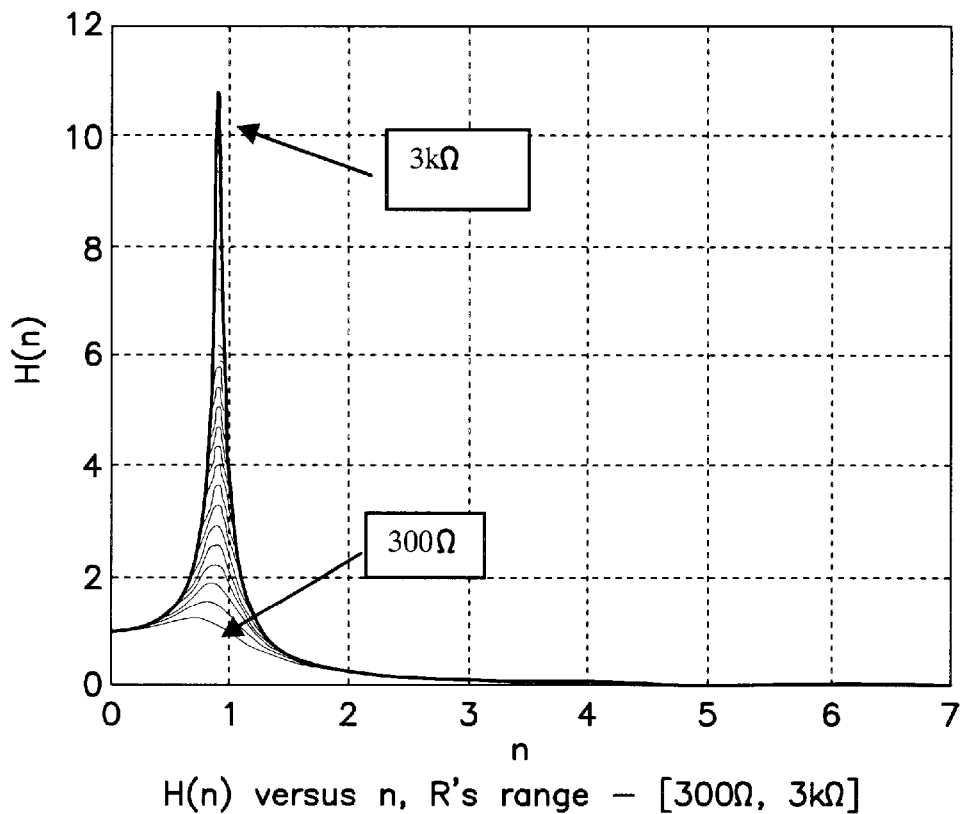
FIG. 6 is a plot of ($a$) transfer function against load, and ($b$) output voltage error under different loads showing the effect of harmonic components.

As shown in FIG. 6(a), H(n) decreases sharply for $n \geq 3$, especially when R is large. $v_{SH}(t)$ has small effect on $v_{OUT}(t)$, the effect of $v_{OUTH}(t)$ can be neglected, therefore $$v_{OUT}(t) \approx v_{OUTI}(t) = \quad (13)$$

$$-\frac{4V_{DC}}{\pi} \frac{R[\omega_S L \cos(\omega_S t) + R(\omega_S C \omega_S L - 1)\sin(\omega_S t)]}{(\omega_S L)^2 + R^2(\omega_S L \omega_S C - 1)^2}$$

$$V_{OUT} \approx V_{OUTI} = \frac{4V_{DC}}{\sqrt{2}\,\pi} \frac{R}{\sqrt{(\omega_S L)^2 + R^2(\omega_S L \omega_S C - 1)^2}} \quad (14)$$

Figure 5B:
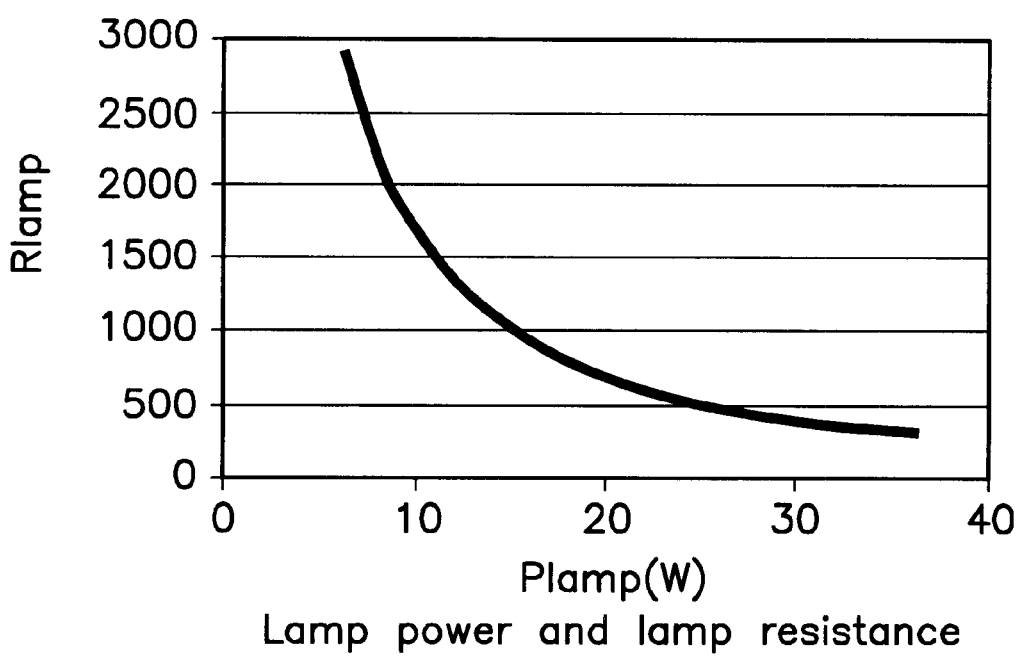
Figure 6B:
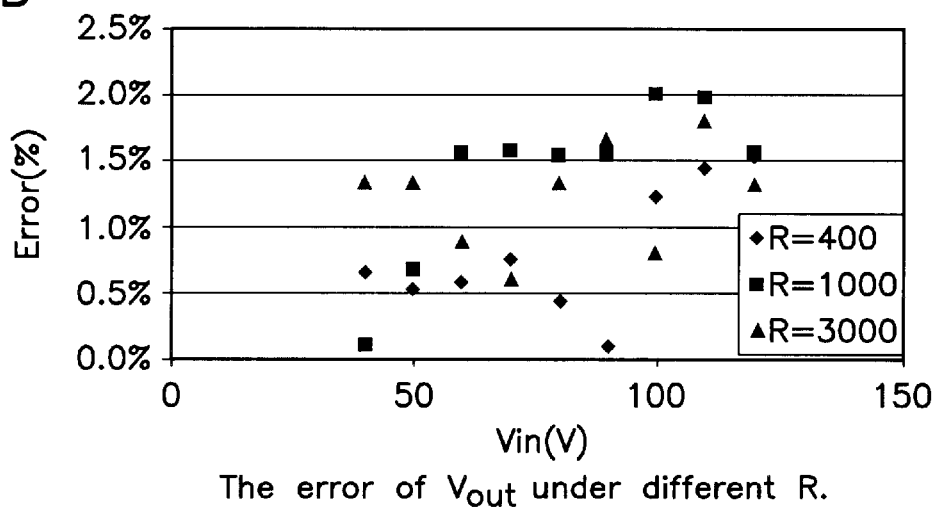

In FIG. 5(b), the fluorescent lamp resistance varies from about 300 Ω to 3 kΩ between lamp power's range—[36 W, 6 W]. In an experiment, the fluorescent lamp may be replaced by a resistor R. Under different $V_{DC}$, the RMS value of output voltage $V_{OUT}$ is taken and compared with the calculated value (14). The parameters of the prototype are L=360 uH, C=4.7 nF, $\omega_s=(2\pi)$ 135 kHz. The resistance equals to 400 Ω, 1 kΩ and 3 kΩ respectively, the absolute error of $V_{OUT}$ is shown in FIG. 6(b), the maximum error is about 2% when $V_{DC}$ changes from 40V to 120V. The high accuracy confirms that the calculation of $V_{OUT}$(14) is feasible.

Figure 7A:
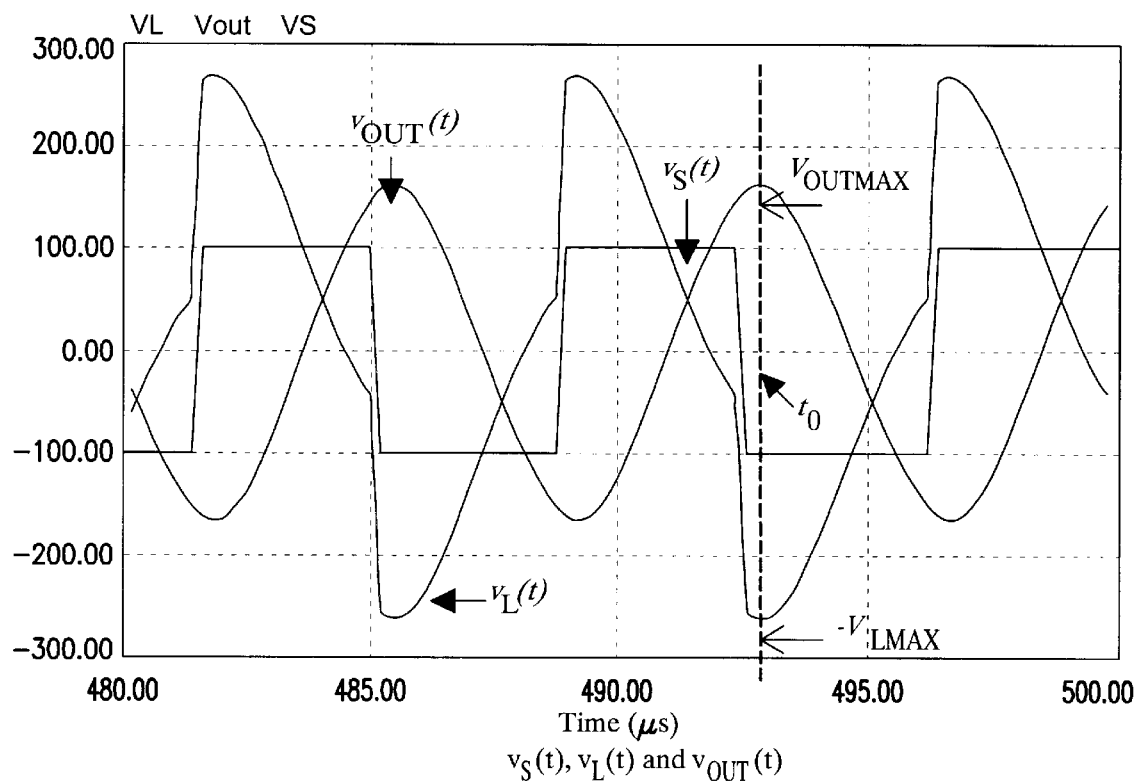
FIG. 7 is a plot of ($a$) voltage and ($b$) current simulation curves.
Figure 7B:
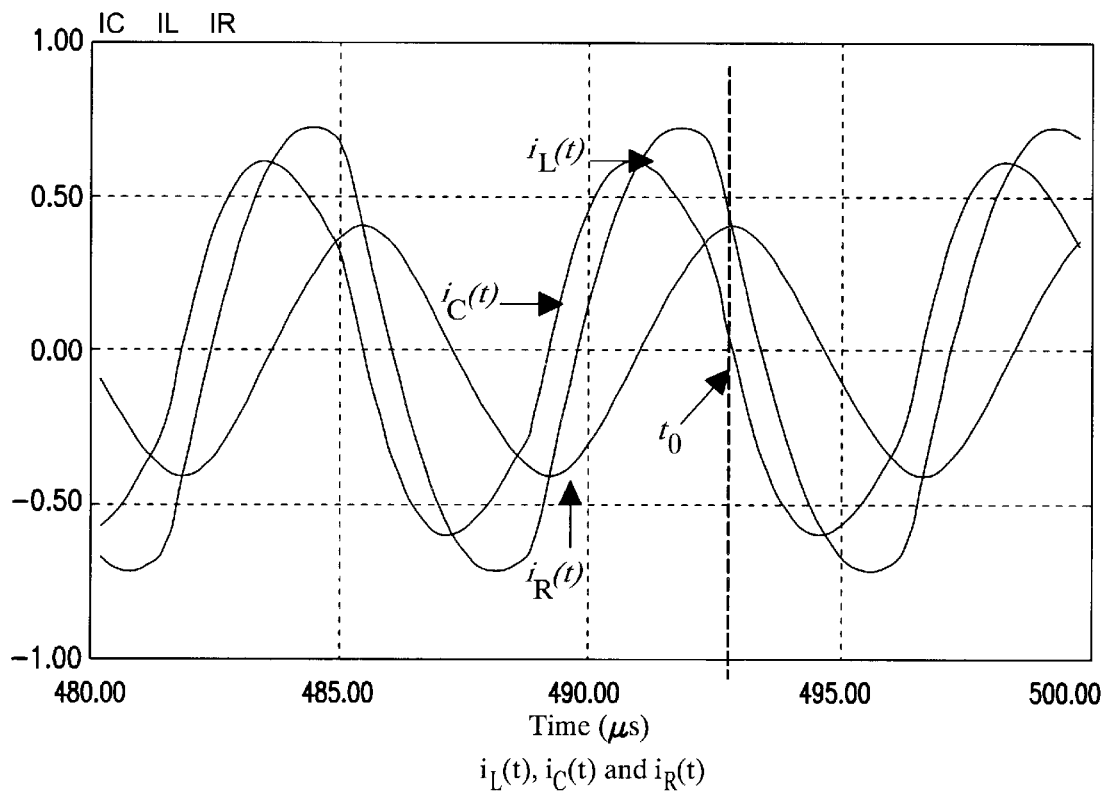

As shown in FIG. 7, when $t=t_0$ in one cycle, $i_C(t_0)=0$, i.e., $$\frac{d V_{OUT}(0)}{dt} = 0,$$

$$\Rightarrow \tan(\omega_S t_0) = \frac{R(\omega_S^2 LC - 1)}{\omega_S L} \quad (15)$$

Thus, the maximum value of output voltage $v_{OUT}(t)$ happens at $t=t_0$, $$v_{OUT}(t_0) = V_{OUTMAX} = \frac{4V_{DC}}{\pi} \frac{R}{\sqrt{(\omega_S L)^2 + R^2(\omega_S^2 LC - 1)^2}} \quad (16)$$

and the maximum value of $i_R(t)$ is $$I_{RMAX} = \frac{V_{OUTMAX}}{R} = \frac{4V_{DC}}{\pi} \frac{1}{\sqrt{(\omega_S L)^2 + R^2(\omega_S^2 LC - 1)^2}} \quad (17)$$

Based on (4), at $t=t_0$, $$-V_{DC} = v_L(t_0) + v_{OUT}(t_0)$$

$$v_L(t_0) = -V_{DC} - v_{OUT}(t_0) = -V_{DC} - V_{OUTMAX} = -V_{LMAX}$$

Then the maximum value of inductor voltage $v_L(t)$ is $$V_{LMAX} = V_{DC} + V_{OUTMAX} \quad (18)$$

$$= V_{DC}\left[1 + \frac{4}{\pi} \frac{R}{\sqrt{(\omega_S L)^2 + R^2(\omega_S^2 LC - 1)^2}}\right]$$

The RMS value of $i_R(t)$ is $$I_R = \frac{V_{OUT}}{R} = \frac{4V_{DC}}{\sqrt{2}\pi} \frac{1}{\sqrt{(\omega_S L)^2 + R^2(\omega_S^2 L\omega_S C - 1)^2}} \quad (19)$$

Comparing (17) and (19), $$I_{RMAX} = \sqrt{2} I_R \quad (20)$$

$$i_L(t_0) = i_C(t_0) + i_R(t_0) = i_R(t_0) = \frac{v_{OUT}(t_0)}{R} = I_{RMAX} \quad (21)$$

Figure 8:
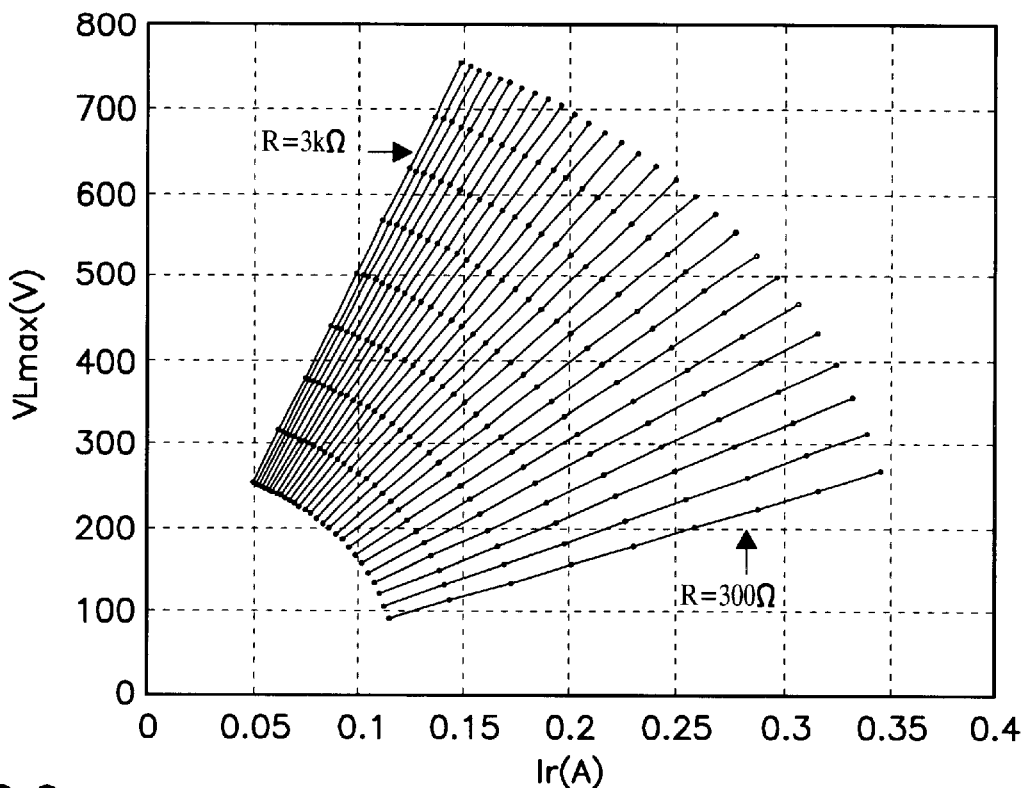
FIG. 8 is a plot showing the relationship between lamp current and maximum lamp voltage.

FIG. 8 shows the relationship between $I_R$ and $V_{LMAX}$ under different R when $V_{DC}$ changes from 40V to 120V. Different R has its unique slope of $I_R$ and $V_{LMAX}$, the slope stands for the value of resistance indirectly.

The slope of $I_R$ and $V_{LMAX}$ can be expressed as $$K(R) = \frac{V_{LMAX}}{I_R} \quad (22)$$

By substituting (18) and (19) into (22), $$K(R) = \frac{\sqrt{2}}{4}\pi\sqrt{(\omega_S L)^2 + R^2(\omega_S^2 LC - 1)^2} + \sqrt{2} R \quad (23)$$

Figure 9:
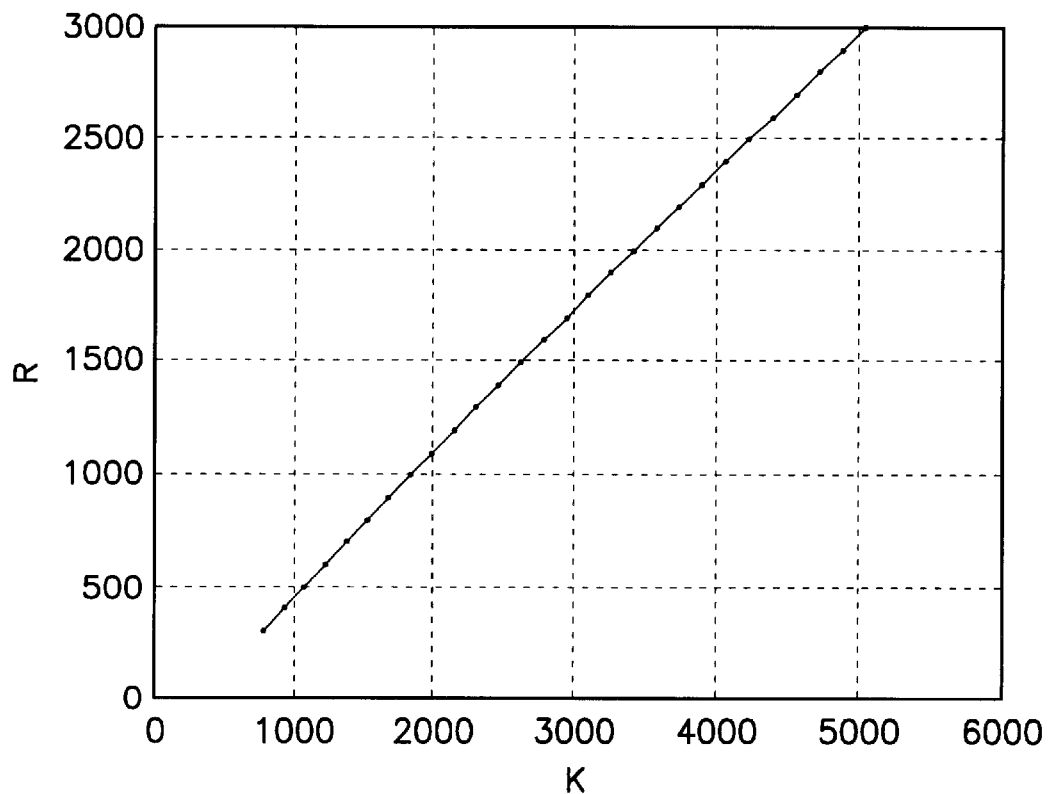
FIG. 9 is a plot showing the relationship between lamp current, maximum lamp voltage and lamp resistance.

The relationship of K(R) and R in the prototype is shown in FIG. 9.

The resistance equation can be expressed as $$R = aK + b = a\frac{V_{LMAX}}{I_R} + b \quad (24)$$

The output power can be defined by $$P = V_R I_R = I_R^2 R \quad (25)$$

Put (24) into (25), $$P = I_R(aV_{LMAX} + bI_R) \quad (26)$$

Based on equation (18), the DC link voltage $V_{DC}$ equals to $$V_{DC} = V_{LMAX} - I_{RMAX}R = (1-\sqrt{2}a)V_{LMAX} - \sqrt{2}bI_R \quad (27)$$

The on-line lamp characteristic can be defined by (24), (26) and (27) after obtaining $V_{LMAX}$ and $I_R$. $V_{LMAX}$ can be achieved from $v_L(t)$ by a peak detector easily, and $I_R$ can be achieved from $v_L(t)$ too, because based on (20) and (21), $$I_R = \frac{\sqrt{2}}{2} I_{RMAX} = \frac{\sqrt{2}}{2} i_L(t_0) \quad (28)$$

It will be seen from the above that simply by using a single sensor to sense inductor voltage $v_L$ or inductor current $i_L$, the on-line lamp characteristic can be obtained.

Figure 10A:
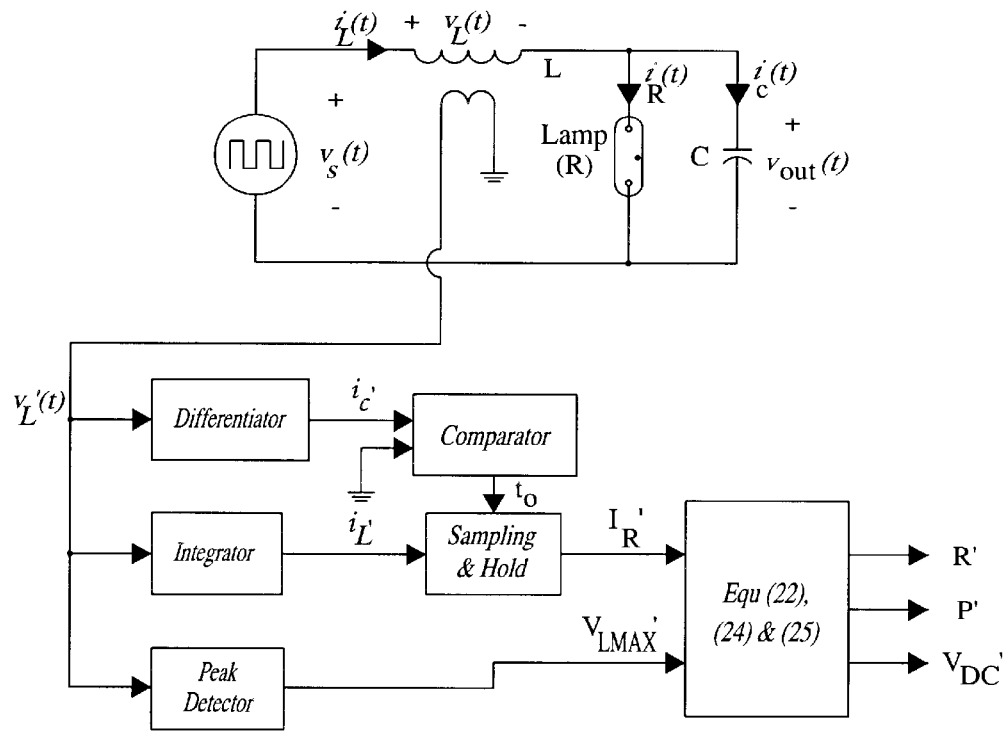
FIG. 10 is ($a$) a circuit digram of a second embodiment and ($b$) a third embodiment of the present invention.
Figure 10B:
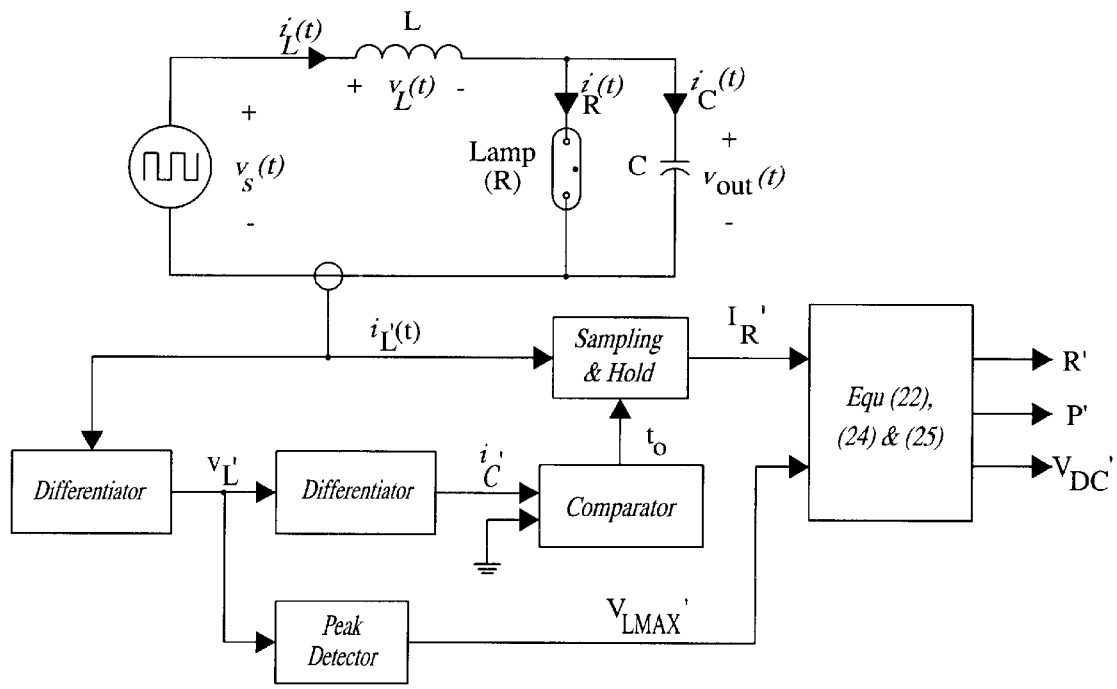

The single-sensor principle can be implemented either using a voltage or a current sensor as shown in FIG. 10. In FIG. 10(a), an extra coupled winding on the inductor is used as a voltage sensor for sensing the inductor voltage $v_L$. In FIG. 10(b), a current sensor (e.g. Hall-effect current sensor) is used to get inductor current $i_L$.

In one embodiment of the invention, the single-sensor principle is demonstrated by the single voltage sensor approach.

Referring to FIG. 10(a), the scale-down inductor voltage $v_L(t)$ can be obtained by an extra coupled winding on the inductor. The estimated maximum inductor voltage (i.e., $V_{LMAX}$) can be obtained by a peak detector. The scale-down inductor current $i_L(t)$ can be obtained by integrating $v_L(t)$. Comparing the differentiated $v_L(t)$ with zero, the moment of $i_c(t)=0$(i.e., $t_0$) can be achieved, because 0.

$$v_L(t) = v_S(t) - v_{out}(t)$$

$$v_L(t) = \quad (29)$$

$$v_S(t) - v_{OUT}(t) \Rightarrow \frac{dv_L(t)}{dt} = \frac{dv_S(t)}{dt} - \frac{dv_{OUT}(t)}{dt} \Rightarrow \left.\frac{dv_L(t)}{dt}\right|_{t=t_0} = 0$$

Because when $t=t_0$, $$\frac{dv_{OUT}(t)}{dt} = 0, \frac{dv_S(t)}{dt} = 0.$$

Based on (26), the estimated output current $I_R$ can be obtained by sampling and holding $i_L(t)$ at $t_0$. Therefore, not only the resistance but also the output power and DC link voltage can be estimated at the same time by estimating the inductor voltage.

In FIG. 10(b), a current transducer is used to obtain the scale-down inductor current $i_L(t)$. $v_L(t)$ comes from differentiating $i_L(t)$, $V_{LMAX}$ and $I_R$ can be obtained by the similar technique in FIG. 9(a).

Figure 11A:
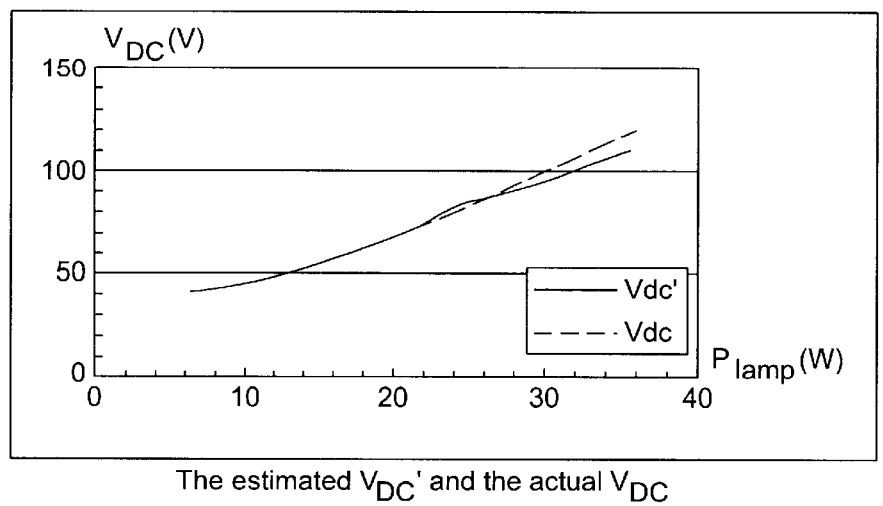
FIG. 11 is a plot of estimated and measured ($a$) input voltage against lamp power, ($b$) lamp resistance against lamp power and ($c$) lamp power, of the second embodiment of the invention.
Figure 11B:
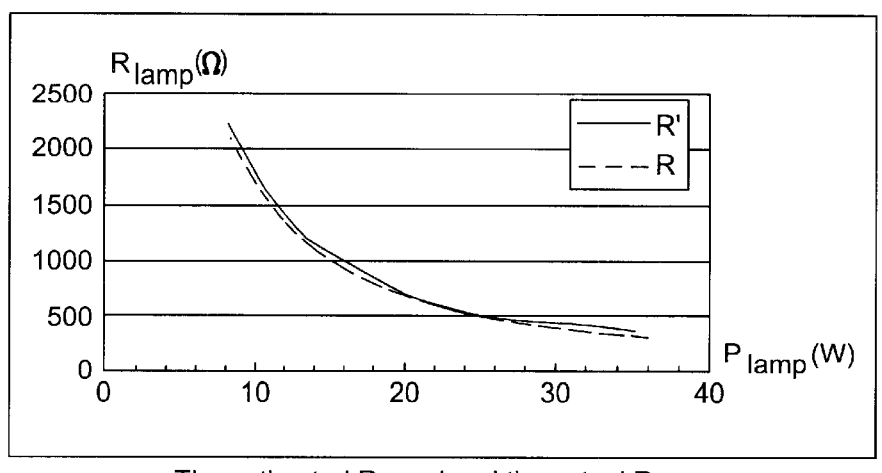
Figure 11C:
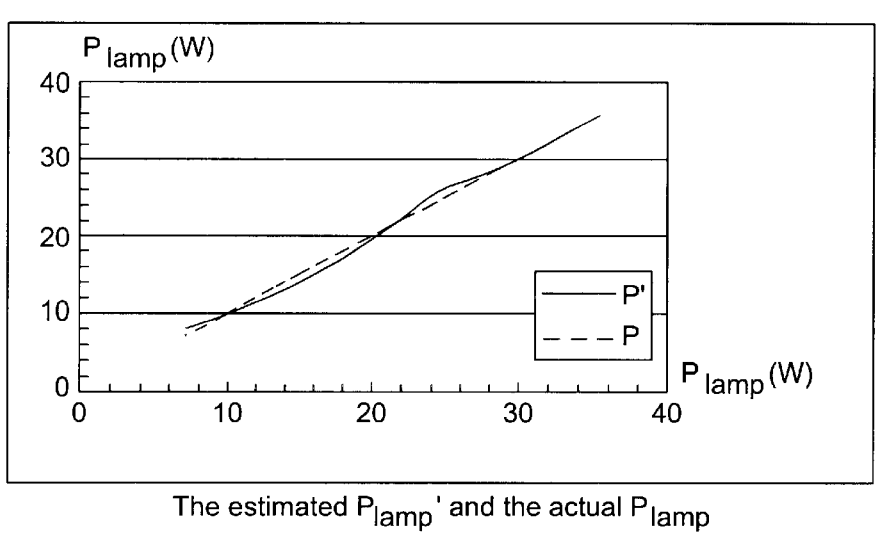

FIGS. 11(a)–(c) show the measured and estimated values of the dc link voltage $V_{DC}$, lamp resistance $R_{lamp}$ and lamp power $P_{lamp}$, respectively. The dotted lines represent the measurements and the solid lines represent the estimations using the single voltage sensor approach as shown in FIG. 9(a). The estimations are found to be consistant with measurements.

The present invention has been illustrated above by means of an example in the form of a fluorescent discharge lamp. However, the present invention is also applicable to other forms of discharge lamps such as high intensity discharge (HID) lamps. Indeed the present invention may be particularly useful in the context of HID lamps because they can suffer from are vibration problems. By monitoring the load resistance using an embodiment of the invention the stability of such an HID lamp may be monitored and controlled.

What is claimed is:

1. Apparatus for determining characteristic(s) of a discharge lamp operated by a high-frequency electronic ballast including a resonant tank comprising an inductor and a capacitor, wherein said characteristic(s) are selected from the group consisting of lamp input voltage, lamp resistance and lamp power, comprising a single sensor for measuring the inductor voltage and/or current, and means for determining said characteristic(s) from the measured inductor voltage and/or current obtained by said single sensor and not other direct measurement.

2. Apparatus as claimed in claim 1 comprising means for obtaining the lamp current and the maximum inductor voltage from the measured inductor voltage and/or current, and wherein said characteristic(s) determining means determines said characteristics from said lamp current and maximum inductor voltage.

3. Apparatus as claimed in claim 1 wherein said characteristic determining means implements the equations:

$$R = aK + b = a\frac{V_{LMAX}}{I_R} + b$$

where R is the lamp resistance, $V_{LMAX}$ is the maximum inductor voltage, $I_R$ is the lamp current and a,b are constants;
$P=I_R(aV_{LMAX}+bI_R)$ where P is lamp power; and
$V_{DC}=V_{LMAX}-I_{RMAX}R=(1-\sqrt{2}a)V_{LMAX}-\sqrt{2}bI_R$ where $V_{DC}$ is the input voltage.

4. Apparatus as claimed in claim 3 wherein said apparatus comprises a sensor for measuring the inductor voltage, means for differentiating the inductor voltage to obtain a capacitor current, means for integrating the inductor voltage to obtain an inductor current, means for obtaining the lamp current from the capacitor current and the inductor current, and peak detector means for detecting the maximum inductor voltage.

5. Apparatus as claimed in claim 4 wherein said sensor comprises an extra coupled winding on the inductor.

6. Apparatus as claimed in claim 3 wherein said apparatus comprises a sensor for measuring inductor current, means for differentiating the inductor current to obtain an inductor voltage, means for differentiating the inductor voltage to obtain a capacitor current, means for obtaining the lamp current from the capacitor current and the inductor current, and peak detector means for detecting the maximum inductor voltage.

7. Apparatus as claimed in claim 3 wherein said sensor comprises a Hall-effect current sensor.

8. Apparatus for determining the lamp power, lamp resistance and input voltage of a discharge lamp driven by a power converter circuit including an inductor, comprising a single sensor for measuring the inductor voltage or inductor current, and means for determining the lamp power, lamp resistance and/or input voltage from said measured inductor voltage or inductor current obtained by said single sensor and no other direct measurement.

9. A method for determining the characteristic(s) of a discharge lamp operated by a high-frequency electronic ballast including a resonant tank comprising an inductor and a capacitor, wherein said characteristic(s) are selected from the group consisting of lamp input voltage, lamp resistance and lamp power, comprising measuring the inductor voltage and/or inductor current using a single sensor, and determining said characteristic(s) from the measured inductor voltage and/or current obtained by said single sensor and no other direct measurement.

10. A method as claimed in claim 9 wherein the lamp current and the maximum inductor voltage are obtained from the measured inductor voltage and/or current, and wherein said characteristic(s) is/are determined from said lamp current and maximum inductor voltage.

11. A method as claimed in claim 9 wherein said characteristic(s) is/are determined from the equations:

$$R = aK + b = a\frac{V_{LMAX}}{I_R} + b$$

where R is the lamp resistance, $V_{LMAX}$ is the maximum inductor voltage, $I_R$ is the lamp current and a,b are constants;
$P=I_R(aV_{LMAX}+bI_R)$ where P is lamp power; and
$V_{DC}=V_{LMAX}-I_{RMAX}R=(1-\sqrt{2}a)V_{LMAX}-\sqrt{2}bI_R$ where $V_{DC}$ is the input voltage.

12. A method as claimed in claim 11 comprising measuring the inductor voltage, differentiating the inductor voltage to obtain a capacitor current, integrating the inductor voltage to obtain an inductor current, obtaining the lamp current from the capacitor current and the inductor current, and detecting the maximum inductor voltage.

13. A method as claimed in claim 11 comprising measuring the inductor current, differentiating the inductor current to obtain an inductor voltage, differentiating the inductor voltage to obtain a capacitor current, obtaining the lamp current from the capacitor current and the inductor current, and detecting the maximum inductor voltage.

14. A method for determining the lamp power, lamp resistance and input voltage of a discharge lamp driven by a power converter circuit including an inductor, comprising measuring the inductor voltage or inductor current only, and determining the lamp power, lamp resistance and/or input voltage from said measured inductor voltage or inductor current and no other direct measurements.

15. Apparatus for determining the input and/or output voltage of a power electronics converter circuit including an inductor, comprising a single sensor for sensing the voltage across said inductor, and means for calculating the input and output voltage from said inductor voltage only and no other direct measurements.

16. Apparatus as claimed in claim 15 comprising means for integrating the inductor voltage to obtain an inductor current.

17. Apparatus as claimed in claim 16 comprising means for obtaining a load resistance from the inductor current and the output voltage.

18. A method for determining the input and/or output voltage of a power electronics converter circuit including an inductor, comprising sensing only the voltage across said inductor, and calculating the input and output voltage from said inductor voltage only and no other direct measurements.

19. A method as claimed in claim 18 comprising integrating the inductor voltage to obtain an inductor current.

20. A method as claimed in claim 19 comprising obtaining a load resistance from the inductor current and the output voltage.

21. A method of monitoring the load resistance of a discharge lamp driven by a power electronics converter circuit including an inductor, comprising sensing either an inductor current or inductor voltage only and deriving the load resistance from a measurement of the inductor voltage or inductor current from said sensing step and no other direct measurement.

22. Apparatus for monitoring the load resistance of a discharge lamp driven by a power electronics converter circuit including an inductor, comprising a single sensor for measuring an inductor current or inductor voltage, and means for deriving the load resistance from the measured inductor voltage or inductor current obtained by said single sensor and no other direct measurement.

* * * * *